United States Patent [19]

Weyrich et al.

[11] Patent Number: 4,531,142
[45] Date of Patent: Jul. 23, 1985

[54] LIGHT EMITTING DIODE HAVING SILICON CARBIDE LAYERS

[75] Inventors: Claus Weyrich, Gauting; Guenther Ziegler, Erlangen; Ludwig Hoffmann; Dietmar Theis, both of Munich, all of Fed. Rep. of Germany

[73] Assignee: Siemens Aktiengesellschaft, Berlin & Munich, Fed. Rep. of Germany

[21] Appl. No.: 466,921

[22] Filed: Feb. 16, 1983

[30] Foreign Application Priority Data

Mar. 10, 1982 [DE] Fed. Rep. of Germany ....... 3208638

[51] Int. Cl.³ ............................................. H01L 33/00
[52] U.S. Cl. ........................................ 357/17; 357/56; 357/61; 357/65
[58] Field of Search ....................... 357/17, 61, 56, 30, 357/62, 65

[56] References Cited

U.S. PATENT DOCUMENTS 4,316,208 2/1982 Kobayashi et al. ................... 357/17

OTHER PUBLICATIONS

W. V. Munch and W. Kurzinger, Solid State Electronics, vol. 21, No. 9, Sep. 1978, pp. 1129-1132.

Primary Examiner—James W. Davie
Assistant Examiner—Georgia Y. Epps
Attorney, Agent, or Firm—Hill, Van Santen, Steadman & Simpson

[57] ABSTRACT

A light emitting diode has a substrate body consisting of silicon carbide, which is transmissive for the luminescent radiation generated by the diode. The diode has a first epitaxially deposited layer, consisting of silicon carbide of a first conductivity type, disposed on the substrate body, and a second epitaxially deposited layer of silicon carbide of a second conductivity type disposed on the first layer. The diode has one electrode connected to the second layer and another electrode connected to an exposed portion of the first layer.

7 Claims, 5 Drawing Figures

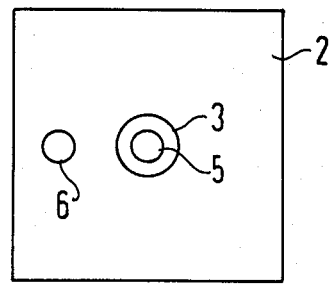
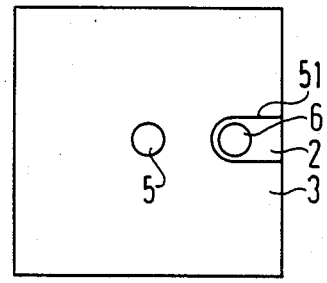

ial layer, but is emitted in the direction of the substrate and is largely absorbed in the densely doped silicon carbide substrate body. This lost portion of the radiation constitutes a significant portion of the total luminescent radiation generated at the junction.

LIGHT EMITTING DIODE HAVING SILICON CARBIDE LAYERS

BACKGROUND OF THE INVENTION

1. Field of the Invention

The present invention relates to a light emitting diode, and particularly relates to a light emitting diode consisting at least in part of silicon carbide layers.

2. Description of the Prior Art

A light emitting diode consisting of layers of silicon carbide is known in the art which exhibits a mesa structure. This structure consists of a densely doped p-conductive substrate body consisting of silicon carbide, for achieving a low track resistance, having a surface on which a first epitaxially deposited layer consisting of silicon carbide with aluminum doping is grown. A second layer of silicon carbide, doped with aluminum and nitrogen so as to be n-conductive is disposed on the first silicon carbide layer. The actual mesa structure is formed not only by the two layers, but also by a significant portion of the substrate body, with portions of the substrate body surrounding the layered mesa being removed. One electrode is applied to the top-most layer of the mesa structure for supplying a bias current to the device. A cooperating electrode is formed by metallization of the side of the substrate body opposite to the side on which the mesa structure is formed.

Such a conventional silicon carbide light emitting diode emits blue light. The light is emitted in a direction radiating away from the substrate body and the mesa structure thereon, as viewed from the substrate body. Luminescent radiation is generated in the transition layer, but is emitted in the direction of the substrate and is largely absorbed in the densely doped silicon carbide substrate body. This lost portion of the radiation constitutes a significant portion of the total luminescent radiation generated at the junction.

SUMMARY OF THE INVENTION

It is an object of the present invention to provide a light emitting diode comprised of layers of silicon carbide which permits substantially all of the generated radiation to be available for use and thus has a higher light yield than conventional silicon carbide diodes.

The above object is inventively achieved in a light emitting diode having a silicon carbide semiconductor substrate with a first epitaxially grown layer also consisting of silicon carbide (of a first conductivity type) on the substrate body, and a second epitaxially grown layer of silicon carbide (of an oppositely conductivity type) situated on the first layer. The silicon carbide comprising the substrate body is doped at such a low density such that the substrate body is substantially transparent for the luminescent radiation generated at the junction between the first and second layers when the diode is biased. One biasing electrode is connected to the top-most epitaxial layer, and the other corresponding electrode is connected to an exposed portion of the first epitaxial layer.

The use of an electrically insulating or slightly doped substrate body permits radiation emitted at the pn-junction to penetrate into the substrate body without significant absorption therein. In a further embodiment of the invention, the side of the substrate body opposite the pn-junction can be mirrored so that incident light from the pn-junction is reflected back through the substrate body, thus intensifying the normally-emitted light which is radiated in the direction away from the substrate.

The diode may be constructed simply of epitaxially grown silicon carbide layers, or may exhibit a mesa structure, the mesa structure including only the top-most epitaxial layer, the other epitaxial layer between the top-most layer and the substrate remaining substantially flat. The intermediate layer (between the top-most layer and the substrate) has a surface conductor run to which the cooperating electrode is connected. This intermediate layer must also have a thickness, at least in the area of the cooperating electrode and in the area beneath the top-most layer permeated by the bias current, such that the series resistance for the bias current through the diode does not assume too large a value.

Instead of a mesa construction, the diode disclosed and claimed herein may be constructed such that the intermediate layer is entirely, or substantially entirely covered. In the case of complete coverage, a lateral electrical contact to the intermediate layer is necessary for the cooperating electrode. The intermediate layer may be exposed at an aperture in the topmost layer either in the form of a hole or an edge recess, which is sufficiently large to permit an electrical contact to extend through the top-most layer for connection to the intermediate layer.

DESCRIPTION OF THE DRAWINGS

FIG. 4 is a plan view of the embodiment shown in FIG. 1.

FIG. 5 is a plan view of an embodiment substantially corresponding to FIG. 3, with a recess aperture at a side of the diode.

DESCRIPTION OF THE PREFERRED EMBODIMENTS

Figure 1:
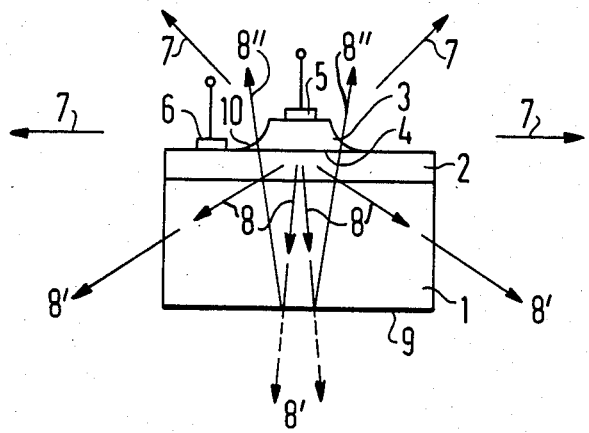
FIG. 1 is a side view of a light emitting diode constructed in accordance with the principles of the present invention in a first embodiment having a mesa structure.

A light emitting diode constructed in accordance with the principles of the present invention is shown in FIG. 1. The diode includes a substrate body 1, an intermediate layer 2 and an upper layer 3. A pn-junction 4 exists between the layers 2 and 3 at which luminescent radiation is generated. A first electrode 5 for supplying bias current to the diode is connected to the upper layer 3. A second electrode, referred to herein as the cooperating electrode, is referenced at 6 and is connected to the intermediate layer 2.

The arrows referenced 7 indicate the direction of propagation of a portion of the luminescent radiation emitted by the diode disclosed and claimed herein. This portion of the emitted radiation, propagated away from the substrate body of the diode, corresponds to radiation emitted by conventional light emitting diodes. In addition to the radiation 7, however, the light emitting diode disclosed and claimed herein emits additional radiation 8′, resulting from radiation 8 emitted into the substrate 1, which is normally lost in conventional light emitting diodes due to absorption in the substrate body 1. The substrate body 1 of the present invention is comprised of only slightly, that is, not densely, doped silicon carbide, so as to be substantially transparent for the radiation 8, which emerges as radiation 8'.

Additional intensity in one direction of light propagation can be achieved by applying a mirrored surface 9 to the surface of the substrate 1 opposite the junction 4, so that the radiation 8 is reflected and emerges as radiation 8''.

The intermediate layer 2 and the upper layer 3 are epitaxially grown. The intermediate layer 2 may be doped with aluminum so as to be of a first conductivity type, and the upper layer 3 may be doped with aluminum and nitrogen for generating a layer of an opposite conductivity type, the density of nitrogen doping being predominant such that the opposite conductivity type exists.

Figure 2:
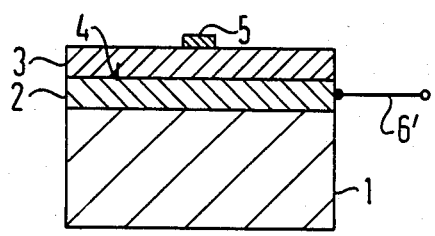
FIG. 2 is a sectional view of a light emitting diode constructed in accordance with the principles of the present invention in a second embodiment having a laterally connected cooperating electrode.
Figure 3:
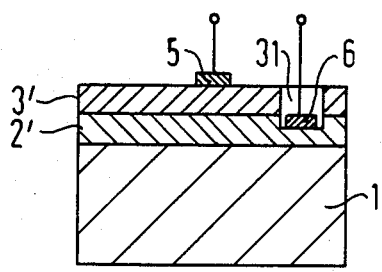
FIG. 3 is a sectional view of a light emitting diode constructed in accordance with the principles of the present invention in a third embodiment having a cooperating electrode applied through an aperture in the top-most epitaxial layer.

The diode may exhibit a mesa structure, as in FIGS. 1 and 4, or the upper layer 3 may completely, or substantially completely, cover the intermediate layer 2 as shown in FIGS. 2, 3 and 5. In all figures, identical components are identified by the same reference numerals.

In the mesa embodiment shown in FIG. 1, the upper layer 3 is in the form of a mesa 10. The edge of the mesa 10 extends at least to the point at which the cooperating electrode 6 is disposed, which constitutes generally the edge of the diode. A bias current path between the two electrodes 5 and 6 is formed which does not depend on any portion of the substrate body 1, which is electrically insulating. The layer 2 is still thick enough, particularly below the electrode 6, such that its cross-section causes no noticeable series resistance for the bias current. It is also possible for the mesa 10 to extend up to or into the substrate body at locations adjacent to the cooperating electrode 6.

The embodiment shown in FIG. 2 shows an intermediate layer 2 which is completely covered by the upper layer 3. A laterally-applied cooperating electrode 6' is connected to an exposed side of the intermediate layer 2.

In another embodiment shown in FIG. 3, the intermediate layer 2' is substantially completely covered by the upper layer 3', however the upper layer 3' has an aperture 31 which exposes a portion of the intermediate layer 2' for attachment of the cooperating electrode 6. A plan view of a slightly modified version of this embodiment is shown in FIG. 5, wherein a recess 51 at a side of the upper layer 3 exposes a portion of the intermediate layer 2 for connection of the electrode 6, instead of the hole-like aperture 31 shown in FIG. 3.

Although modifications and changes may be suggested by those skilled in the art it is the intention of the inventors to embody within the patent warranted hereon all changes and modifications as reasonably and properly come within the scope of their contribution to the art.

We claim as our invention:

1. A light emitting diode comprising:
   a silicon carbide substrate body;
   an intermediate epitaxial layer consisting of silicon carbide of a first conductivity type grown on said substrate body;
   an upper epitaxial layer consisting of silicon carbide of a second conductivity type grown on said first layer;
   each of said epitaxial layers having an electrode directly connected thereto for biasing said diode; and
   said substrate body being doped such that said substrate body is substantially transparent for radiation generated at a junction between said intermediate layer and said upper layer upon the application of bias current to said electrodes.

2. The light emitting diode of claim 1 wherein said intermediate layer is doped with aluminum for generating said first conductivity type and wherein said upper layer is doped with aluminum and nitrogen for generating said second conductivity type, said nitrogen doping predominating said aluminum doping.

3. The light emitting diode of claim 1 wherein said electrode connected to said intermediate layer is connected laterally at a side thereof.

4. The light emitting diode of claim 1 wherein said upper layer has an aperture therein exposing a portion of said intermediate layer at which one of said electrodes is connected to said intermediate layer.

5. The light emitting diode of claim 4 wherein said aperture is a recess at a side of said intermediate and upper layers.

6. The light emitting diode of claim 4 wherein said aperture is a hole-like aperture.

7. The light emitting diode of claim 1 wherein said upper layer is in the form of a mesa structure disposed on said intermediate layer.

* * * * *